United States Patent [19]
West

[11] Patent Number: 5,986,267
[45] Date of Patent: Nov. 16, 1999

[54] ASYMMETRICALLY SPLIT CHARGED COUPLED DEVICE

[75] Inventor: John West, Yardley, Pa.

[73] Assignee: Princeton Instruments, Inc., Trenton, N.J.

[21] Appl. No.: 08/965,209

[22] Filed: Nov. 6, 1997

[51] Int. Cl.[6] .................. H01L 27/148; H01L 29/768

[52] U.S. Cl. .................. 250/370.08; 250/371; 348/298; 348/304; 257/239

[58] Field of Search .................. 348/294, 296, 348/298, 304, 315; 250/339.07, 338.4, 370.08, 371, 390.07; 257/239

[56] References Cited

U.S. PATENT DOCUMENTS

| | | | |
|---|---|---|---|
| 5,432,335 | 7/1995 | West et al. | 250/208.2 |
| 5,821,547 | 10/1998 | Talmi et al. | 250/458.1 |
| 5,838,372 | 11/1998 | Wood | 348/312 |

*Primary Examiner*—Ngân V. Ngô
*Attorney, Agent, or Firm*—Ohlandt, Greeley, Ruggiero & Perle

[57] ABSTRACT

A charged coupled device is disclosed including an asymmetrical split with independent control over the regions on opposite sides of the split. The charge coupled device is configurable for use in multiline or kinetic spectroscopy, and includes two separate horizontal registers with optional charge dump regions for improving efficiency.

7 Claims, 8 Drawing Sheets

ASYMMETRICALLY SPLIT CHARGED COUPLED DEVICE

TECHNICAL FIELD

This invention relates to charge coupled devices, and more specifically, to an improved use of a charge coupled device including an asymmetrical split and for use primarily in spectroscopy applications. The inventive method and apparatus is useful in both kinetic spectroscopy and multiline spectroscopy.

BACKGROUND OF THE INVENTION

Charged coupled devices (CCDs) have been in use for decades and are well known in the field of spectroscopy. Spectroscopy typically involves illuminating one or more rows of a CCD with the spectrum of a signal and then analyzing the captured spectrum represented by the varying magnitudes of charge which accumulate on the various elements of the CCD. For example, if one row of the CCD is used to capture the spectrum, the varying magnitudes of charge along the row represent the varying amplitudes of different wavelengths which comprise the spectrum.

The use of CCDs in spectroscopy may be divided into at least two well known types: multiline spectroscopy and kinetic spectroscopy. Commercially available CCDs are usually extremely application specific, and typically are manufactured for use in either multiline spectroscopy, kinetic spectroscopy, or some other application. Conventional CCDs include little or no ability to adapt to different applications.

Kinetic spectroscopy involves obtaining multiple spectra, one at a time, at a relatively high rate, and then reading them from the CCD. FIG. 1 shows a conceptual diagram of a CCD for use in kinetic spectroscopy. The first row of elements 101 is utilized to capture a spectrum by focusing the desired spectrum only on row 101. After the spectrum is captured at row 101, it is shifted down to row 102 immediately below row 101 and the next spectrum is captured at row 101. In one commercially available CCD, all rows except the top row 101 are masked. Thus, once the spectrum is captured and shifted down into row 102, it is no longer subject to distortion from unwanted light signals and the masked rows operate effectively as a memory. Utilizing, for example, an off the shelf 1024×256 CCD 100 of the type described, approximately 65,000 spectra per second may be collected for subsequent read-out through horizontal register 103 and amplifier 104.

Although the arrangement shown in FIG. 1 has been widely accepted in the prior art for performing kinetic spectroscopy, there are drawbacks to such an arrangement. First, since only one row of CCD elements is typically utilized to capture the spectrum, the device is not very sensitive. If the spectrum is focused on plural rows of CCD elements, the device will be more sensitive, however, the read out time will increase dramatically since a spectrum occupying N rows of elements will require N times the read out time when compared with a spectrum occupying one row. The slower read out time is unacceptable in certain applications.

Another problem with the arrangement described is that it is relatively inflexible. Specifically, the CCD with all of its rows except one masked is not suitable for multiline spectroscopy, described below. More particularly, multiline spectroscopy requires several spectra to be captured simultaneously. The availability of only one row of unmasked elements in the arrangement of FIG. 1 is unsuitable. Thus, if the specific application changes, a whole new design is required.

In view of the above, it can be appreciated that there exists a need in the art for a more sensitive CCD based device which is able to capture and read out spectra at a fast rate for use in kinetic spectroscopy, and which is flexible enough to be adapted for different uses.

Multiline spectroscopy is another branch of spectroscopy which is often implemented using CCD devices. FIG. 2 shows a conceptual diagram of a CCD being utilized to effectuate multiline spectroscopy.

In multiline spectroscopy, several separate and distinct spectra are captured by a CCD and read out separately for analysis through horizontal shift register 210. The plural spectra are usually captured simultaneously, and then later shifted out of the CCD sequentially for storage and analysis. The arrangement in FIG. 2 includes such a charge coupled device 200, a plurality of exemplary spectra represented by 201 through 204, and a horizontal register 210 for reading out the spectra. Additionally, the regions 205 through 208 represent separation bands in order to prevent energy from each distinct spectrum from contaminating the energy in the regions storing the other spectra.

In operation, the spectra are first captured on the CCD 200, perhaps with the use of a mechanical shutter. Next, the spectra are read by placing them into horizontal register 210 and then shifting each spectrum from register 210 for later storage, analysis or any other required processing.

A problem with the use of arrangements such as that of FIG. 2 to accomplish multiline spectroscopy is that the dark bands 205 through 208 must be independently read into horizontal register 210 and shifted out. Accordingly, the overall operation of the device is much slower than desirable.

Another problem with the arrangement of FIG. 2 for multiline spectroscopy is that if it is desired to utilize the same chip for kinetic spectroscopy, a large waste in space and time results. Specifically, FIG. 6 shows a conventional CCD device 601 and includes a representation 602 of a single spectrum stored in one row of the device. In operation, the spectrum 602 is transferred into horizontal register 603 for shifting out. The dark charge from region 603 must then also be shifted out. This results in wasted time and thus, slower throughout.

Alternatively, when a device is being utilized to capture single spectrum using the technique described, an arrangement such as that shown in FIG. 7 may be used. The arrangement of FIG. 7 includes a relatively small CCD for capturing a single spectrum and a horizontal register 702 for the read out of such spectrum. However, if it is later desired to do multiline spectroscopy utilizing a larger CCD device, the entire chip would have to be replaced.

In view of the above there exists a need in the art for an improved CCD arrangement for performing multiline and kinetic spectroscopy. Additionally, such device should be adaptable easily for either of the foregoing types of spectroscopy and should be efficient when operated in either mode. Finally, there exists a need for improved speed when performing either type of spectroscopy utilizing CCD devices.

SUMMARY OF THE INVENTION

The above and other problems of the prior art are overcome and a technical advance is achieved in accordance with the present invention which relates to an improved charge coupled device (CCD) which includes an asymmetrical split, independent control over the regions on each side of the asymmetrical split, and two horizontal registers for reading information from the CCD. The horizontal registers, one on each side of the CCD, are also independently controllable like the shifting on each side of the asymmetrical split.

In operation, the device may be used for kinetic spectroscopy or for multiline spectroscopy. In either case, a spectrometer, for example, is preferably utilized to capture light, split it into its spectrum, and convey the spectrum to the CCD.

When utilized for kinetic spectroscopy, a single spectrum may occupy multiple rows of elements, thereby increasing sensitivity over prior art single row spectroscopy devices. Unlike the prior art however, unacceptable additional read out time is not required because the spectra may be binned at the asymmetrical split, a technique only possible due to the independent control of the regions of the CCD on opposite sides of the split.

The inventive device is also capable of rapidly transferring sequentially acquired spectra to a horizontal register for read out while independently transferring dark charge, in the opposite direction, to a different horizontal register. Accordingly, when operating in the kinetic spectroscopy mode, charge in the relatively small region on one side of the asymmetrical split is shifted in the opposite direction from the dark charge on the other side of the asymmetrical split. The additional time required to read out the dark charge through the horizontal register is thus avoided, as any dark charge is read out substantially simultaneous with the reading out of the captured spectrum.

When it is desirable to use the inventive device in the multiline spectroscopy mode, plural spectra are captured in the relatively large region of the CCD on one side of the asymmetrical split and binned into a smaller number of rows on the relatively smaller side of the asymmetrical split. The binning is done such that (i) the average binning rate is equal to the ratio of the number of rows in the relatively larger region of the CCD divided by the number of rows in the relatively smaller region of the CCD, and (ii) the separation bands of dark charge are binned into separate rows from those into which spectra are binned. This allows for multiple row spectra, relatively quick read out, and easy configurability of the CCD to be used efficiently for both multiline and kinetic spectroscopy.

For purposes herein, an asymmetrically split CCD is a CCD wherein the region controllable on one side of said split is at least twenty percent larger than the region on the other side thereof.

DETAILED DESCRIPTION OF THE PREFERRED EMBODIMENT

Figure 1:
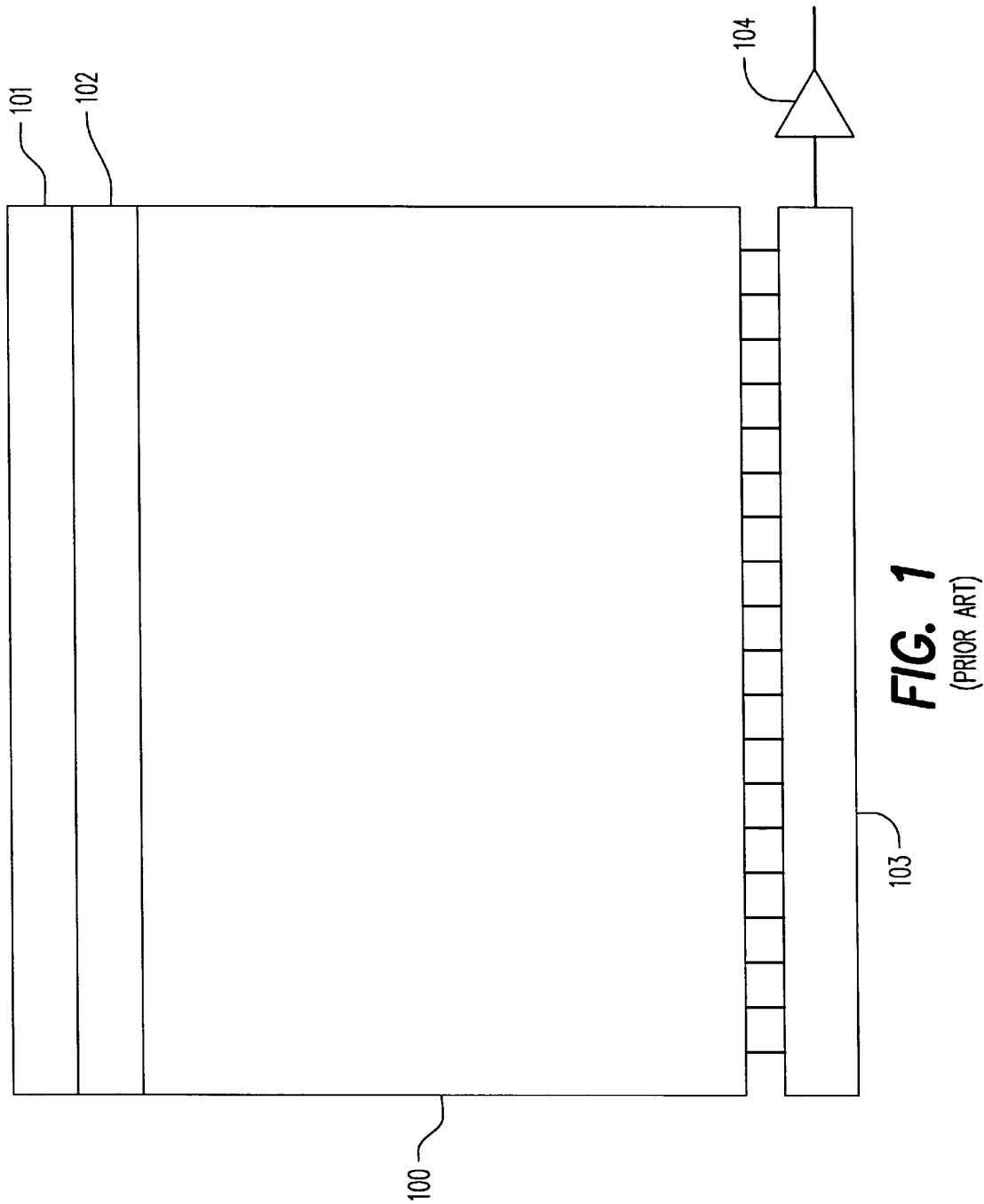
FIG. 1 shows a prior art CCD arranged to implement kinetic spectroscopy.
Figure 2:
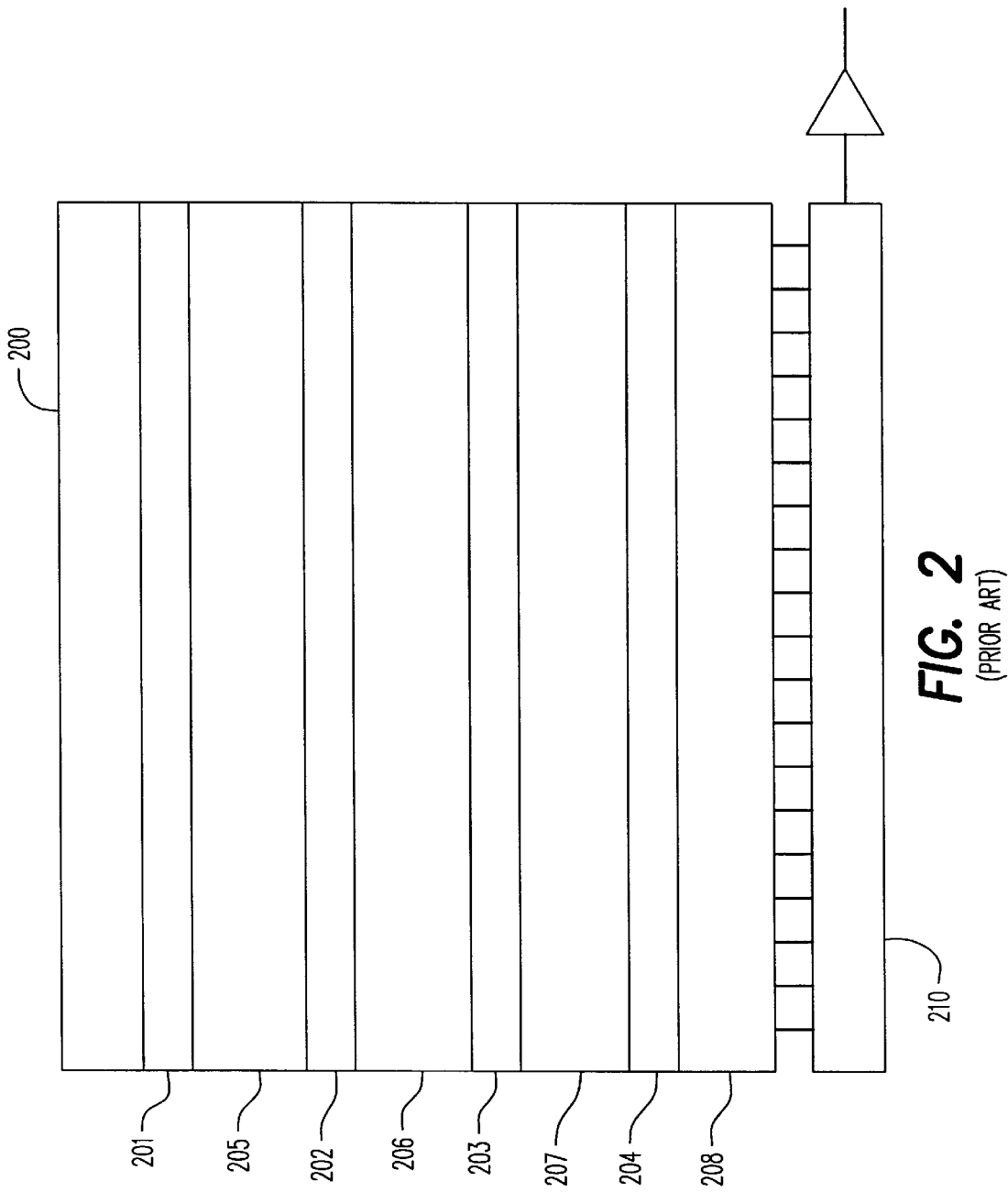
FIG. 2 shows a prior art CCD arranged to implement multiline spectroscopy.
Figure 3:
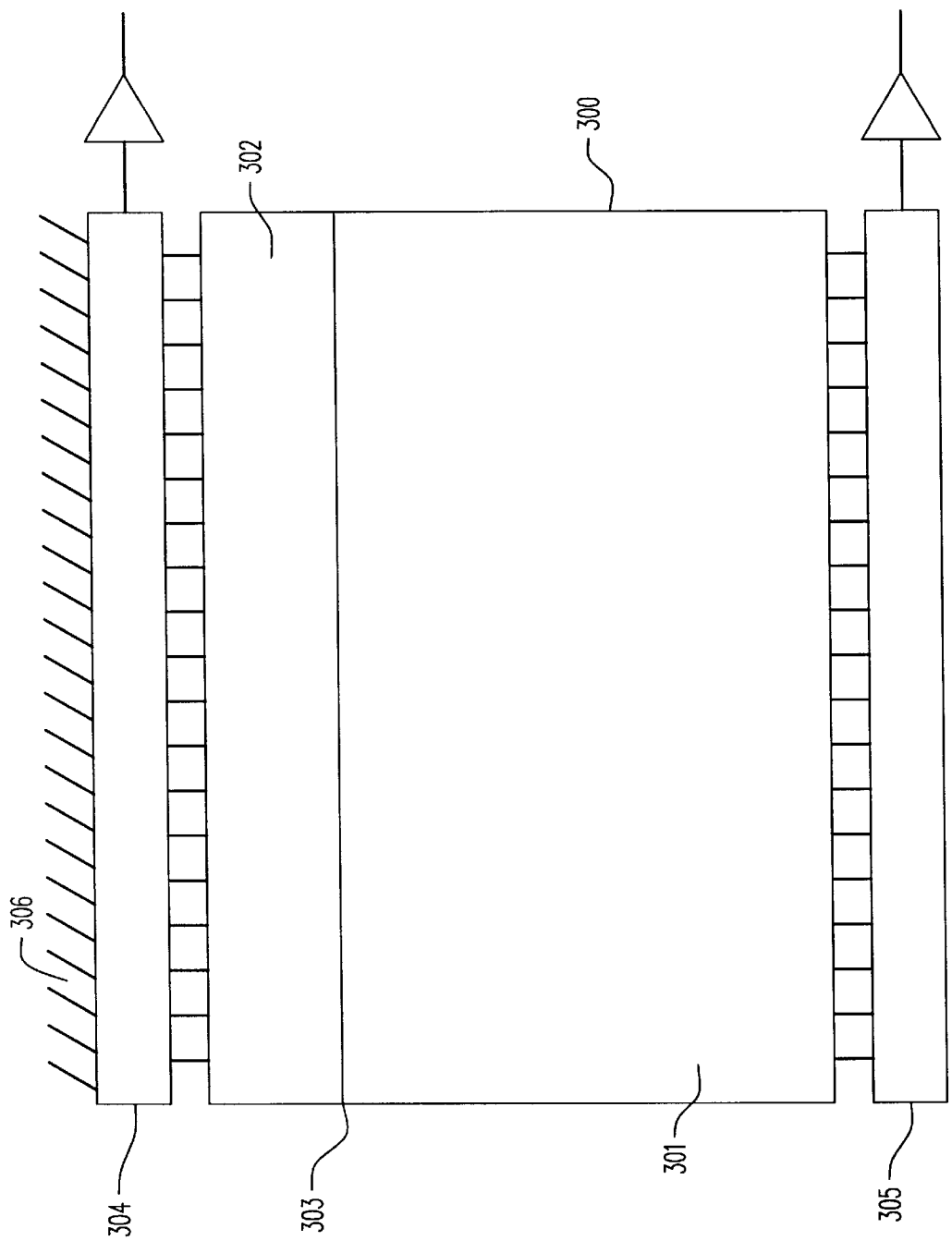
FIG. 3 shows an asymmetrically split CCD device in accordance with the present invention.

FIG. 3 shows a representation of an exemplary embodiment of the present invention comprising a 1340×400 CCD. The arrangement of FIG. 3 includes a novel CCD 300 including a relatively large lower region 301 and a relatively smaller upper region 302 separated by a split 303. The split 303 may be located for example, such that there are 80 rows above it and 320 of the 400 rows below it, with each of the regions 302 and 301 being controllable independently of each other. Specifically, rows of charge on one side of split 303 may be shifted up or down independently of rows of charge on the other side of split 303. Additionally, rows of charge may be shifted across asymmetrical split 303.

While the 320 to 80 ratio in the example of FIG. 3 represents but one workable example, other asymmetrically split arrangements are possible. Importantly, the split is such that the small region 302 is suitable for kinetic spectroscopy while the larger region 301 is suitable for multiline spectroscopy.

The CCD 300 includes two horizontal registers 304 and 305 for reading charge from the CCD 300 independently of one another. One or both of horizontal registers 304 and 305 may include a charge dump area 306 for providing parallel dump of all charge within horizontal register 304 or 305 as the case may be. Techniques for manufacturing such charge dumps are known in the art and will not be described in detail herein.

Figure 4:
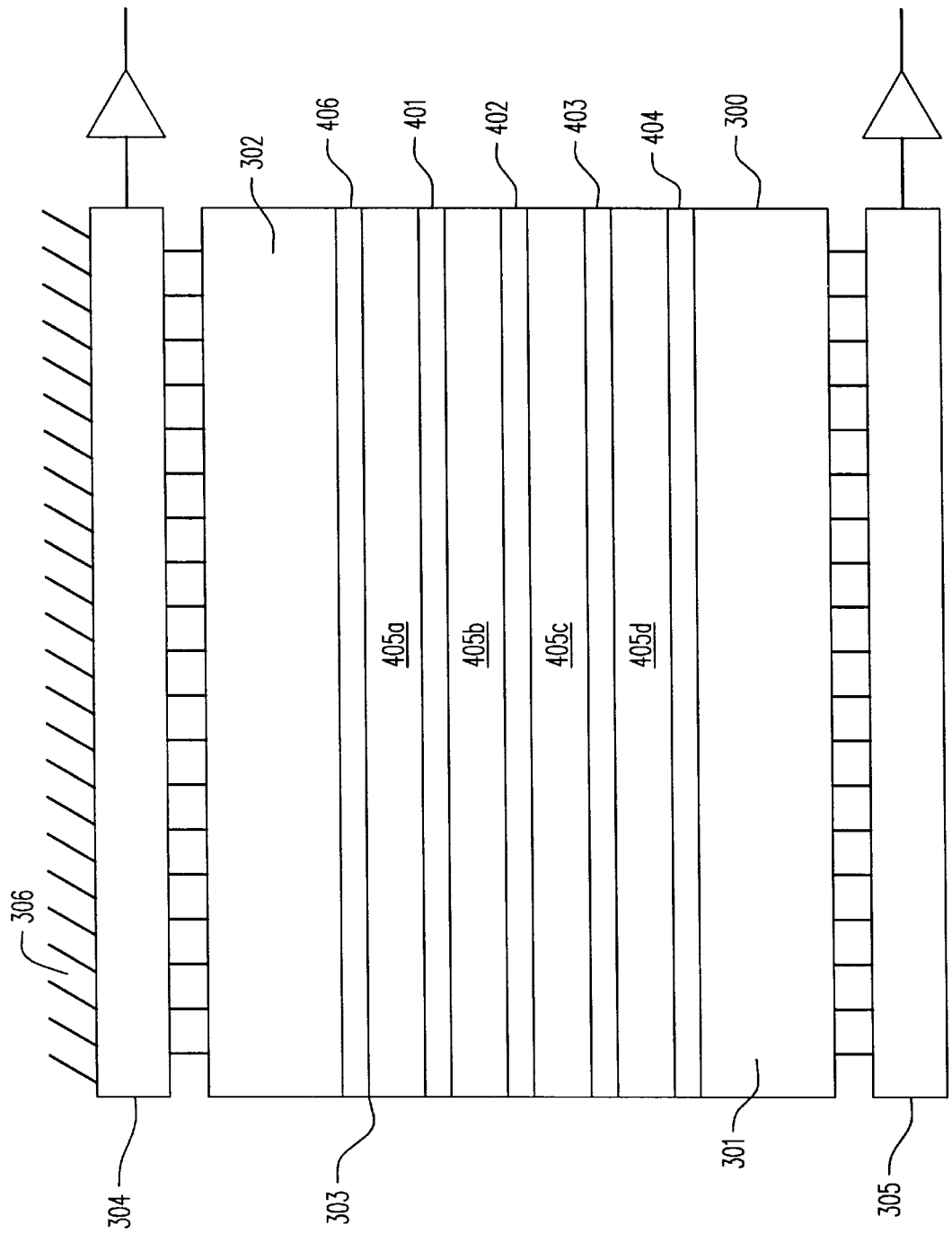
FIG. 4 shows the asymmetrically split CCD device of FIG. 3 when utilized in the multiline spectroscopy mode.

The operation of the novel device will first be described in its mode for utilization in performing multiline spectroscopy. In operation of multiline spectroscopy, a plurality of spectra are placed in region 301, each separated by bands of dark charge in order to prevent interference caused by energy from one spectrum spilling over into another spectrum. FIG. 4 shows a conceptual representation of the device of FIG. 3, utilized in its multiline spectroscopy mode including a plurality of exemplary spectra 401 through 404 included thereon. Spectra 401 through 404 are separated by regions 405 in order to prevent contamination of energy from one spectra to another.

For purposes of explanation, we presume that region 302 comprises eighty rows, and region 301 comprises 320 rows. Since the 320 rows of charge from region 301 are to be placed into region 302, there is a desire to provide for 4 to 1 binning at split 303. Moreover, we presume that each of spectra 401 through 404 is eight rows high, and that region 405 is eight rows as well.

In order to shift out the multiple spectra, the four rows 405a are binned into row 406, the first row above the split 303. The row 406 would then be shifted one row upward, thereby allowing the binning of the next four rows of dark charge from region 405a into row 406. The process continues to repeat itself in a similar manner such that each set of four rows from region 301 is binned into one row in region 302. Since both the light and dark alternating areas in region 301 are eight rows high, the resulting arrangement in region 302 would be (i) two rows of a spectrum comprising four binned rows of spectra from below 301, and (ii) two rows comprising dark charge.

Figure 5:
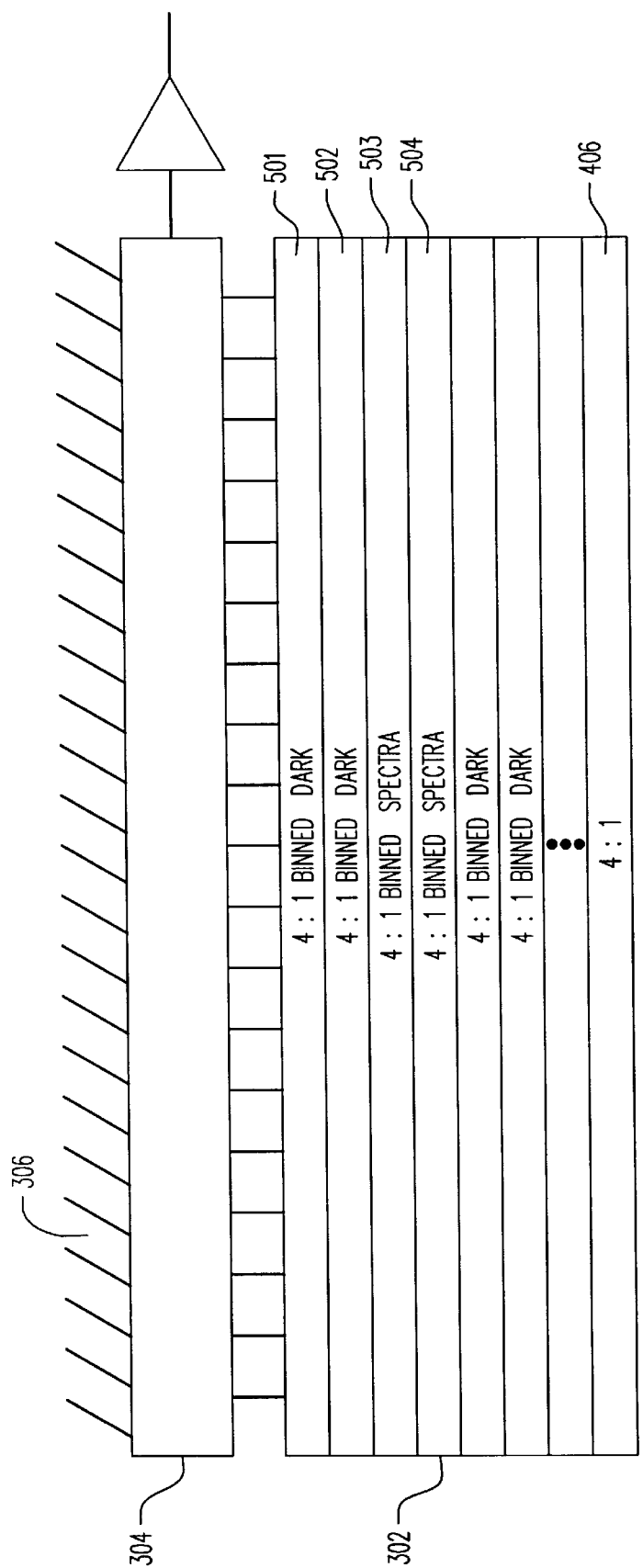
FIG. 5 shows an exploded view of a portion of the CCD device of FIG. 3.
Figure 6:
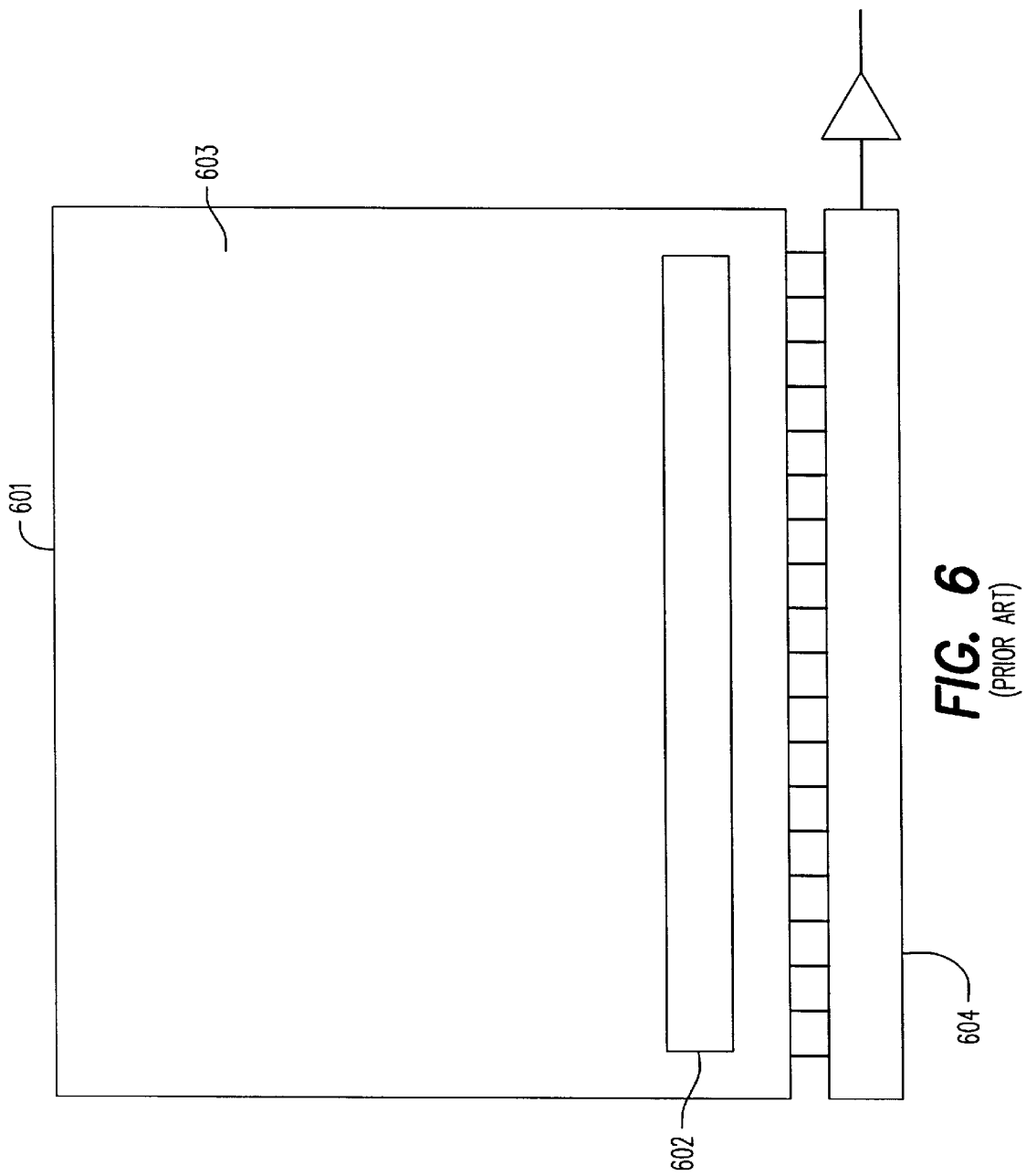
FIG. 6 shows an example of the prior art CCD device being used to capture a single spectrum.
Figure 7:
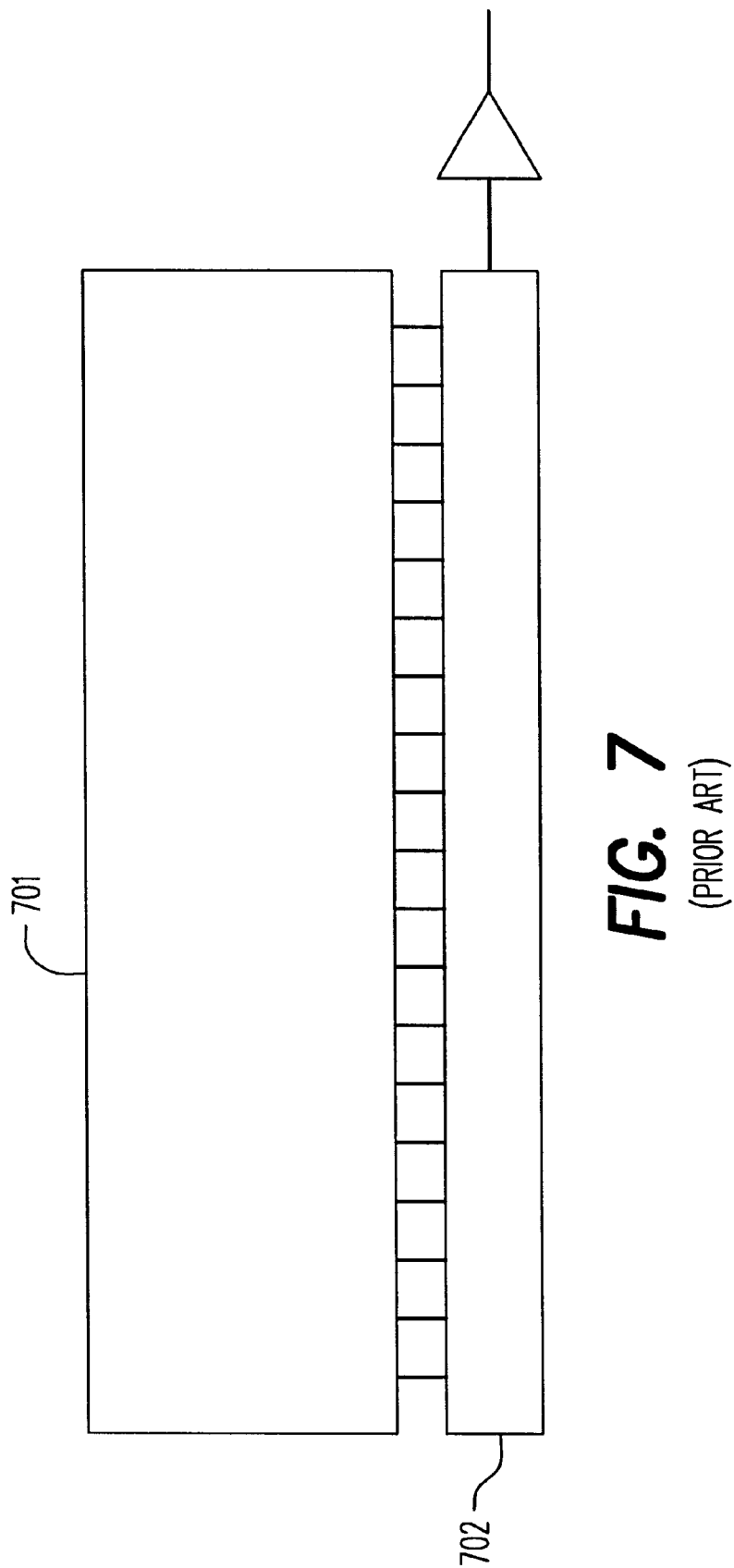
FIG. 7 shows an additional prior art CCD device capturing a single spectrum.

FIG. 5 shows an exploded view of region 302 of the CCD device of FIG. 4 after the operation of the binning at the asymmetrical split described above. Each of the rows 501 and 502 include four rows of dark charge from region 301 of the device, and rows 503 and 504 contain the spectrum. The alternating pattern repeats itself as shown in FIG. 5.

The binned spectra in rows 503 and 504 may then be read out through horizontal register 304. It is also contemplated that an 8 to 1 binning may be used in the foregoing example if the capacity of each CCD element is large enough to hold all required charge.

It can be appreciated from the foregoing that the implementation of multiline spectroscopy utilizing the foregoing arrangement allows for more sensitive spectra to be obtained by providing for multiple row spectrum yet the time required to read out such spectra is minimized due to the binning occurring at asymmetrical split 303.

In a further embodiment, the dark charge from rows 501 and 502 may be quickly eliminated from horizontal register 304. Specifically, improved speed may be achieved by utilizing the charge dump 306 to eliminate the entire dark charge from register 304 in parallel without reading it serially out of horizontal register 304.

It is noted that the binning at the asymmetrical split may not necessarily be constant and need not necessarily divide evenly into the different rows of dark charge and spectra contained in region 301. For example, consider a situation in which the spectra each occupy ten rows and the dark bands therebetween occupy ten rows. If the binning is still desired to be four to one, binning at the asymmetrical split should be done such that the average ratio of rows in region 301 to rows in region 302 is four to one. Additionally, the averaging should be done such that dark charge rows are not mixed with the rows representing spectra.

In the foregoing example, a four to one binning ratio can be used to compress 320 rows in region 301 into 80 rows in region 302 by an arrangement which bins according to the following algorithm: 5 to 1, 5 to 1, 4 to 1, 4 to 1, 2 to 1, 5 to 1, 5 to 1, 4 to 1, 4 to 1, 2 to 1, repeat, etc. In accordance with the foregoing arrangement, the first 10 rows would be binned into two rows of dark charge, and next 10 rows would be binned into three rows of spectrum. Thus, the system provides for efficient multiline spectroscopy by binning, at an asymmetrical split, in such a manner that (i) dark charge and spectra are separated and (ii) the average binning ratio is equal to number of rows in the relatively large portion of the CCD divided by the number of rows in the relatively smaller portion of the CCD.

Figure 8:
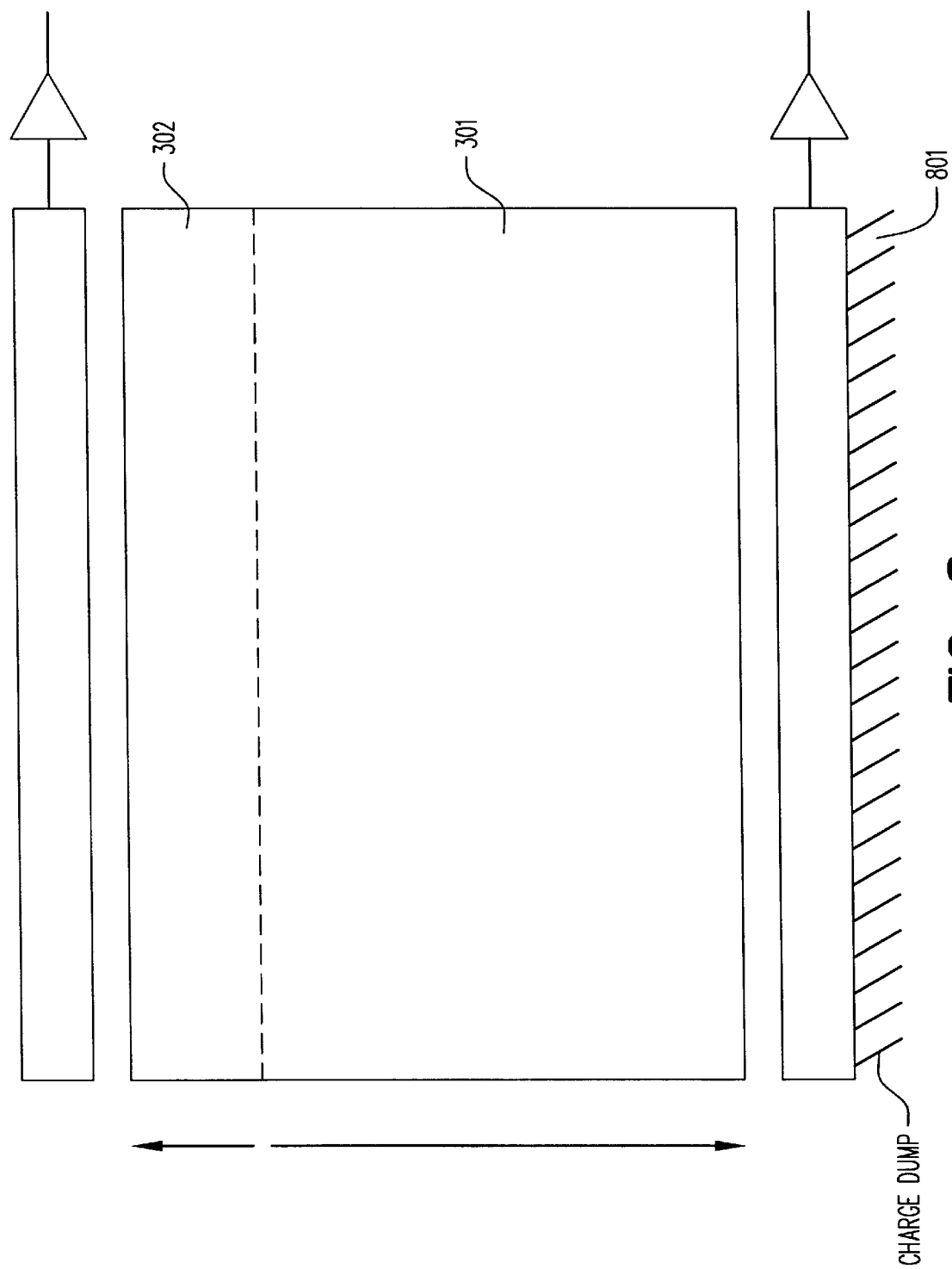
FIG. 8 shows a conceptual view of the inventive apparatus when used in a mode for performing kinetic spectroscopy.

In another embodiment of the present invention, the arrangement of FIG. 3 can be utilized to accomplish kinetic spectroscopy efficiently. Specifically, with reference to FIG. 3, the regions 302 may be utilized to capture a spectrum, and such spectrum may be read out through register 304. However, the remaining dark charge need not be read out since the dark charge in region 301 may be separately controlled and read out through register 305. FIG. 8 shows a conceptual representation of the use of the asymmetrically split CCD utilized to sequentially read out numerous spectra stored in the small region 302 while shifting dark charge out of large region 301. The arrows indicate the direction of charge movement, and the dark charge may be dumped in charge dump 801.

In still another embodiment, kinetic spectroscopy may be accomplished by capturing a single spectrum comprising multiple rows in region 302, binning such multiple row spectrum into one or more rows in region 301, and then capturing a subsequent spectrum in region 302. Thus, plural spectra can be captured sequentially and rapidly, and each one binned into one or more rows in a larger region 301 wherein no light is incident.

The device shown in FIG. 3 may be utilized for multiline spectroscopy as previously described, as well as for kinetic spectroscopy by simply controlling it differently. Specifically, in the case where multiline spectroscopy is desired, the spectra are captured in region 301, binned into region 302, and read out through register 306. On the other hand, when kinetic spectroscopy is desired, the spectra to be analyzed are captured one at a time using plural rows in region 302, and read out through register 304 while the dark charge is dumped through register 305.

By having the ability to shift charge on opposite sides of the asymmetrical split in opposite directions, the larger region of dark charge can be dumped or shifted out through a different register than the spectra, as shown in FIG. 8. Additionally, the device can be configured to operate as a multiline spectroscopy device or a kinetic spectroscopy device by simply using different control software.

While the foregoing describes the preferred embodiment of the invention, it is understood that various enhancements or other embodiments will be apparent to those of skill in the art. These variations are intended to be covered by the following claims.

I claim:

1. A method of performing multiline spectroscopy comprising the steps of:

configuring a charge coupled device with an asymmetrical split;

capturing spectra in a first region of said charge coupled device which is on one side of said asymmetrical split and which is relatively larger then a second region on a second side of said asymmetrical split;

binning, at said asymmetrical split, plural spectra into rows of elements located on said second side of said asymmetrical split; and shifting said binned rows out of said charged coupled device through a horizontal register.

2. The method of claim 1 wherein said step of binning comprises binning dark charge into rows separate from rows into which spectra are binned.

3. The method of claim 2 wherein the binning ratio is equal to, on average, the number of rows in the first region of said charge coupled device divided by the number of rows in the second region of said device.

4. A method of binning charge in a charge coupled device having an asymmetrical split, the charge to be binned representing spectra and rows of dark charge, the method comprising the steps of:

binning the rows of spectra from a relatively large first region of said charge coupled device on one side of said asymmetrical split to a relatively small second region of said charge coupled device on another side of said asymmetrical split; and adapting said binning such that the average binning ratio is equal to the number of rows in said first region divided by the number of rows is said second region, the binning ratio during at least one binning operation being different than the average binning ratio, the binning being accomplished such that dark charge is kept separate from spectra.

5. A method of performing spectroscopy comprising:

providing a charge coupled device having an asymmetrical split, a first region on a first side of said split, and a second region on a second side of said split;

transmitting to said charge coupled device a signal indicative of which one of several types of spectroscopy is desired;

in response to said signal, binning charge from said first region to said second region if said signal indicates a first type of spectroscopy is desired, and binning charge from said second region to said first region if said signal indicates a second type of spectroscopy is desired.

6. The method of claim 5 wherein said first type of spectroscopy is multiline spectroscopy and said second type of spectroscopy is kinetic spectroscopy.

7. A method of performing kinetic spectroscopy utilizing a spectrometer and an asymmetrically split charge coupled device, said asymmetrically split charge coupled device having a small region on one side of said asymmetrical split and a large region on an opposite side of said asymmetrical split, said method comprising:

capturing plural spectra, one at a time and sequentially, in said small region;

subsequent to capturing each spectrum, shifting charge representative of said spectrum in said small region out through a first shift register and shifting dark charge from said large region out through a second shift register.

* * * * *